United States Patent

Schaffer et al.

[11] Patent Number: 6,103,539
[45] Date of Patent: Aug. 15, 2000

[54] METHOD AND SYSTEM FOR NONDESTRUCTIVE LAYER DEFECT DETECTION

[75] Inventors: William J. Schaffer, Atascadero; Jenn Y. Liu, Fremont, both of Calif.

[73] Assignee: XMR, Inc., Fremont, Calif.

[21] Appl. No.: 09/178,567

[22] Filed: Oct. 23, 1998

[51] Int. Cl.[7] .................................................. H01L 21/00
[52] U.S. Cl. .................................... 438/4; 438/12; 438/7; 438/16; 438/660
[58] Field of Search .................................. 438/7, 12, 16, 438/660

[56] References Cited

U.S. PATENT DOCUMENTS

| | | | |
|---|---|---|---|
| 4,952,063 | 8/1990 | Opsal et al. | 356/432 |
| 5,233,191 | 8/1993 | Noguchi et al. | 250/306 |
| 5,879,447 | 3/1999 | Okada et al. | 117/8 |

*Primary Examiner*—Matthew Smith
*Assistant Examiner*—Renzo N. Rocchegiani
*Attorney, Agent, or Firm*—Skjerven, Morrill, MacPherson, Franklin & Friel LLP; Alan H. MacPherson; Daniel P. Stewart

[57] ABSTRACT

A method for nondestructive layer defect detection includes projecting radiation such as a laser beam on a surface of the layer. The surface of the layer is heated by the projected radiation so as to melt at least a portion of the layer. An impurity contained in a defect is heated by the projected radiation so as to increase the pressure of the material within the defect sufficiently to cause the impurity to emerge from the defect through the surface of the layer. The layer is then scanned for a visible defect created by the emergence of the impurity from the defect. A wafer scanning system for nondestructive layer defect detection includes a radiation source such as a laser and a wafer support system that supports a semiconductor wafer with a layer formed thereon in alignment with the radiation source. A control system causes the radiation source to project radiation on a surface of the layer sufficiently to (a) melt at least a portion of The layer, (b) heat the contents of any defect formed in the layer, and (c) cause the contents of the defect to erupt from the surface of the layer. The method and system for nondestructive layer defect detection allow hidden defects created in the formation of a layer to be detected without adversely affecting the features underlying the layer in question. A semiconductor wafer in which defects have been detected may therefore be reworked to remove and re-deposit the defective layer, giving considerable cost savings in integrated circuit chip production.

14 Claims, 4 Drawing Sheets

METHOD AND SYSTEM FOR NONDESTRUCTIVE LAYER DEFECT DETECTION

TECHNICAL FIELD OF THE INVENTION

The present invention relates to semiconductor wafer processing, and in particular to a method and system for nondestructive defect detection for semiconductor layers.

BACKGROUND OF THE INVENTION

Damascene processing is commonly used in semiconductor wafer processing to fill vias and trenches formed in a semiconductor substrate with a conductive metal such as tungsten, aluminum or copper for signal routing on the chip. The damascene process typically involves deposition and patterning of a dielectric layer, followed by deposition of barrier and seed layers. Metal is then deposited using chemical vapor deposition (CVD), physical vapor deposition (PVD) or electrochemical deposition (ECD). The deposited metal is then typically planarized by chemical mechanical polishing.

Defects in the metal fill can occur during metal deposition processes used for gap filling. These defects may take the form of voids or weak adhesion at the metal-semiconductor interface, and may degrade chip performance to an unacceptable level. Detection of these defects before further wafer processing takes place eliminates waste and increases efficiency in chip production. Current methods for detecting such defects, such as SEM inspection and electrical testing of the wafer, are time-consuming and not amenable to nondestructive, in-line testing of the full wafer. Other proposed testing methods, such as acoustic detection and positron annihilation spectroscopy, have not demonstrated sufficient sensitivity or throughput to justify industry adoption.

SUMMARY OF THE INVENTION

Therefore, a need has arisen for a wafer defect inspection system that addresses the disadvantages and deficiencies of the prior art. Accordingly, a method and system for nondestructive layer defect detection are disclosed.

In one embodiment of the present invention, a method for detecting defects in a layer includes projecting radiation such as a laser beam on a surface of the layer. The surface of the layer in question is heated by the projected radiation so as to melt at least a portion of the layer. An impurity contained in a defect is heated by the projected radiation so as to increase the pressure of the material within the defect sufficiently to cause the material to emerge from the defect through the surface of the layer. The layer is then scanned for a visible defect created by the emergence of the impurity through the top surface of the layer.

In another embodiment of the present invention, a wafer scanning system includes a radiation source such as a laser and a wafer support system that supports a semiconductor wafer with a layer formed thereon in alignment with the radiation source. A control system causes the radiation source to project radiation on a surface of the layer sufficiently to (a) melt at least a portion of the layer, (b) heat the contents of any defect formed in the layer, and (c) cause the contents of the defect to erupt from the surface of the layer. A visual inspection tool such as a microscope may then be used to detect the visible defect caused by the eruption of the previously hidden defect.

An advantage of the present invention is that hidden defects created in the formation of a layer may be detected. Another advantage of the present invention is that the detection of defects does not adversely affect the features underlying the layer in question. Yet another advantage is that a semiconductor wafer in which defects have been detected may be reworked to remove and re-deposit the defective layer, resulting in considerable cost savings in integrated circuit chip production.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1A:
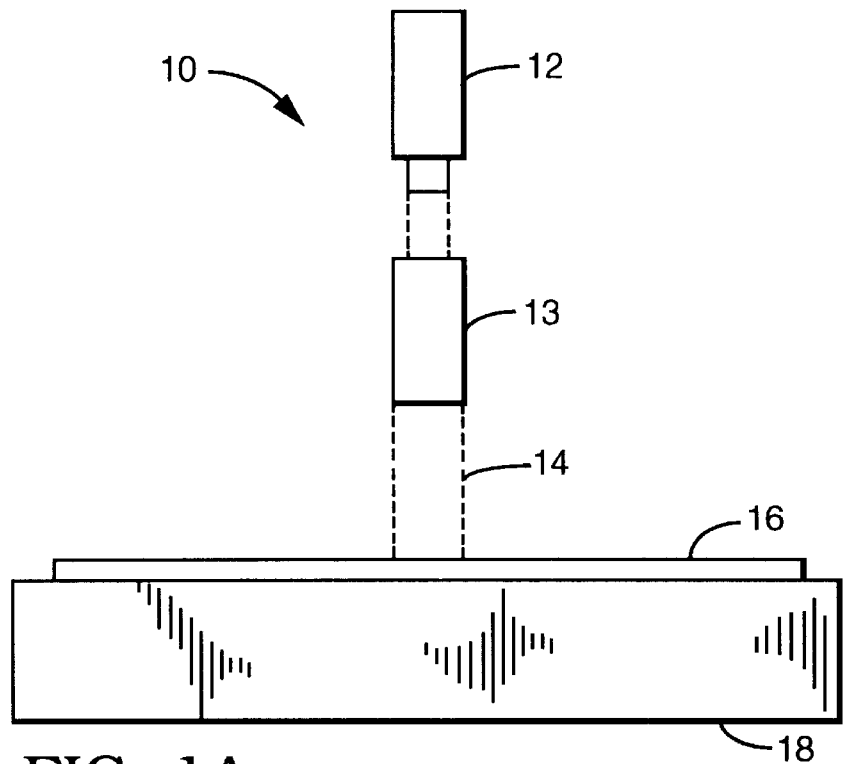
FIGS. 1A and 1B are side and top views, respectively, of a portion of a wafer scanning system constructed in accordance with the present invention.
Figure 1B:
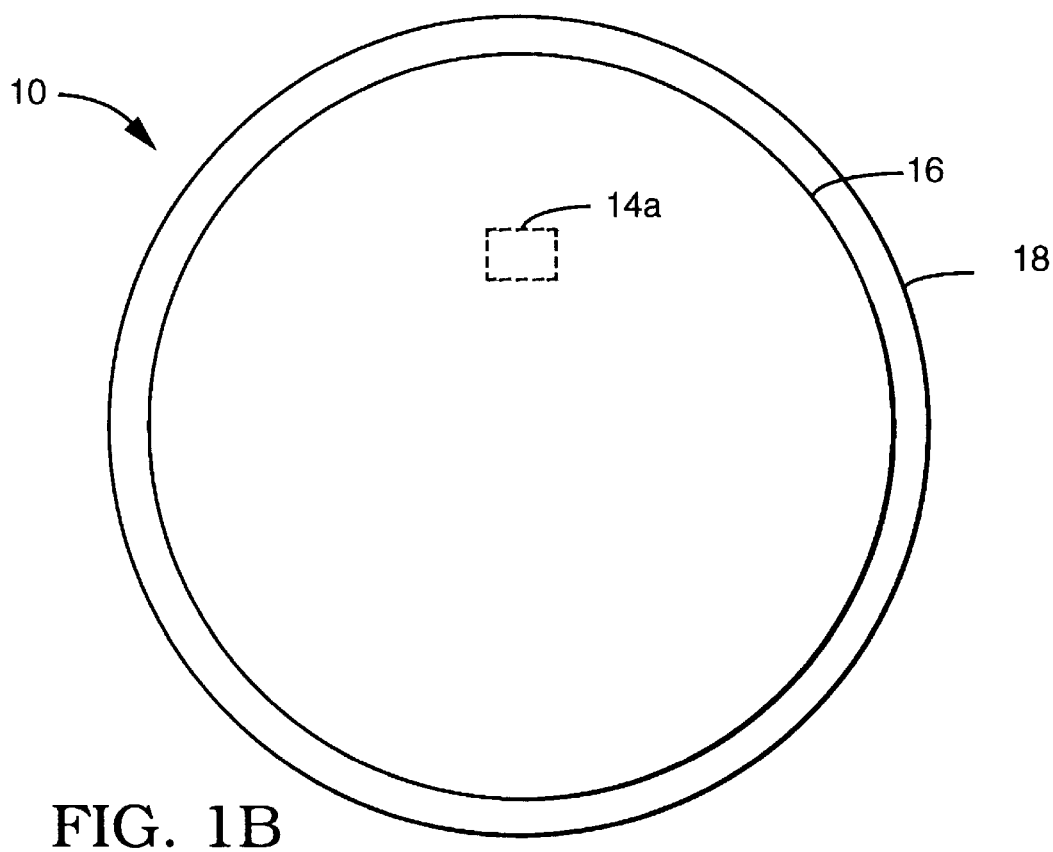

Referring to FIGS. 1A and 1B, side and top views, respectively, of a portion of a wafer scanning system 10 are shown. Wafer scanning system 10 may be, for example, an XMR Model 7100 process platform for handling 200 mm wafers in combination with an XMR Model 5300 laser, both available from XMR, Inc. in Fremont, Calif. Wafer scanning system 10 is operable to make hidden defects in deposited layers visible, allowing a semiconductor wafer to be rejected or reworked before further processing of the wafer, as will be described more fully below.

Wafer scanning system 10 includes a laser 12 and beam optics 13 operable to project a laser beam 14 onto a semiconductor wafer 16. Wafer 16 is supported and positioned by a wafer support system 18, which may be an electrostatic chuck, a vacuum-driven chuck, or some other wafer support system.

Laser 12 may be, for example, a XeCl excimer laser generating a pulsed beam with a wavelength of approximately 308 mm. In one embodiment, laser 12 generates a pulse 50 nanoseconds in duration at a repetition rate of 300 Hz. Beam optics 13 may include a beam homogenizer such as that available with the XMR Model 7100 process platform. Laser 12 and beam optics 13 create a beam spot 14a covering an area appropriate for the delivery of an energy density of approximately 0.8 J/cm$^2$ to the surface of wafer 16. In this example, the area covered by beam spot 14a is 4 mm×10 mm. A suitable radiation source with different wavelength, intensity, pulse duration, repetition rate and beam area may of course be used, in accordance with the principles to be described herein.

Figure 2:
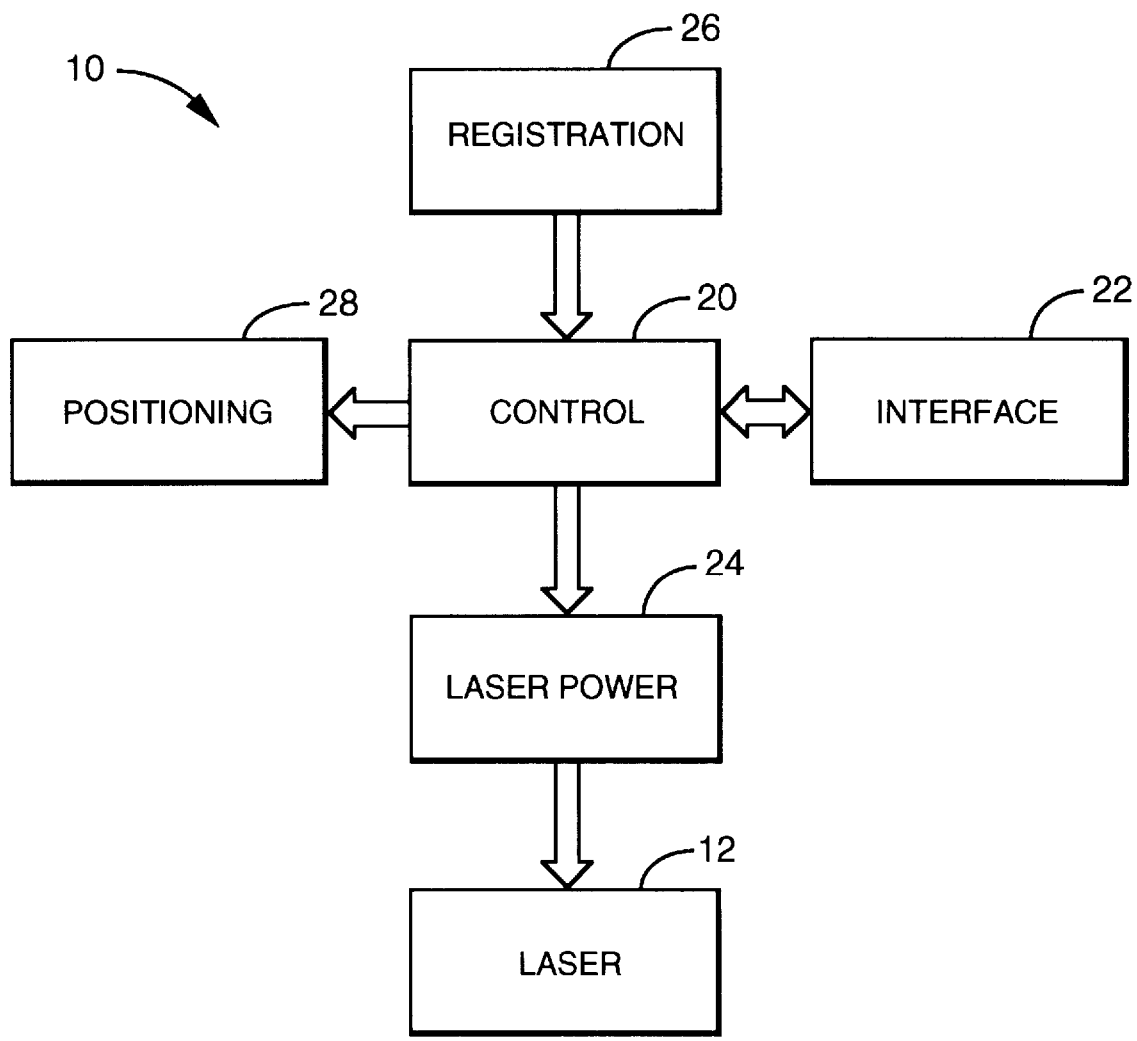
FIG. 2 is a functional block diagram illustrating the operation of the wafer scanning system.

Referring to FIG. 2, a functional block diagram illustrating the operation of wafer scanning system 10 is shown. Wafer scanning system 10 includes a control system 20 for controlling the operation of wafer scanning system 10. Control system 20 is accessible to a user of wafer scanning system 10 by means of an interface system 22. Interface system 22 allows the user to provide commands to control system 20, and also outputs information regarding the operation of wafer scanning system 10 to the user. Thus, interface system 22 may include a computer monitor, keyboard, mouse, printer and/or other well-known user interface devices.

Control system 20 may be implemented as software executed by one or more microprocessors (not explicitly shown). Alternatively, control system 20 may be a hardware or firmware system. Regardless of the implementation, control system 20 is preferably configured to provide the control functions described below.

Control system 20 controls laser power circuitry 24, which powers laser 12. Thus, control system 20 causes laser power circuitry 24 and laser 12 to create a pulsed laser beam 14 with an intensity and repetition rate as described previously.

Control system 20 also controls the positioning of beam spot 14a on the surface of wafer 16. To accomplish this function, control system 20 receives data regarding the relative positions of beam spot 14a and wafer 16 from a registration system 26. Control system 20 then provides control signals to a positioning system 28 to control the relative positions of beam spot 14a and wafer 16. Positioning system 28 may, for example, control the configuration of beam optics 13 so as to move beam spot 14a across wafer 16 in a controlled fashion. Such movement can include raster scanning and direct vector writing. Suitable beam optics 13 with such a positioning system 28 are available from XMR, Inc., with the XMR Model 7100 process platform. Alternatively, positioning system 28 may be an x-y translation stage that controls the position of wafer support system 18.

Figure 3A:
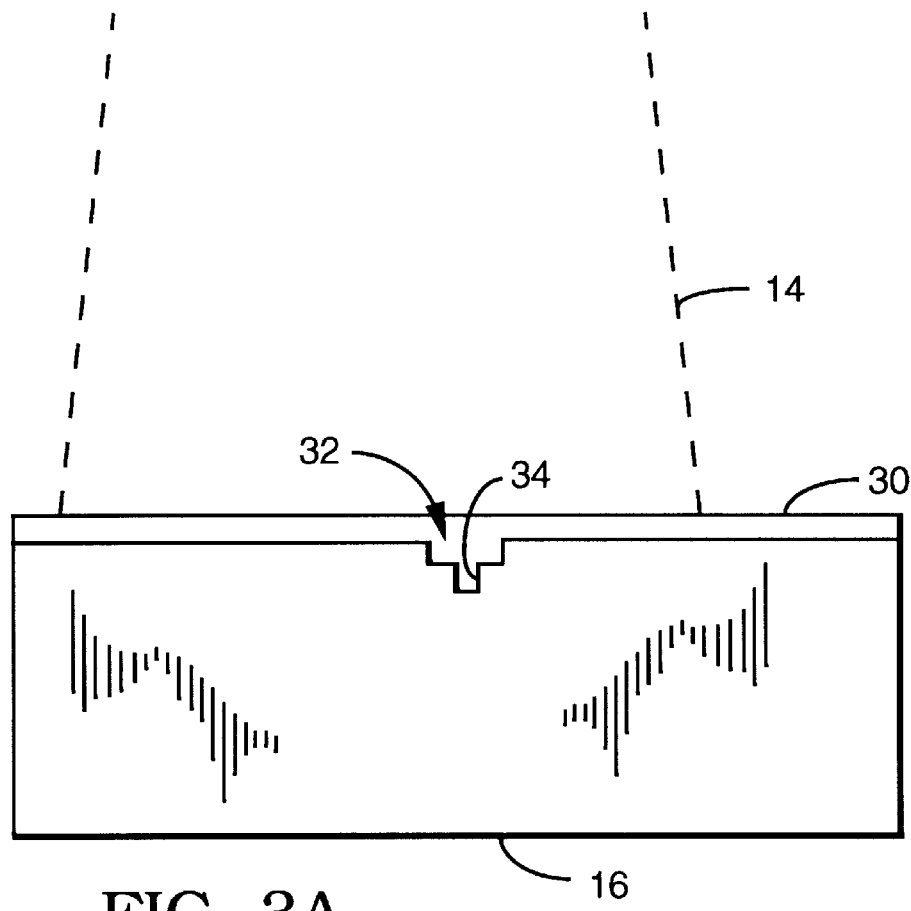
FIGS. 3A and 3B are magnified cross sections of a wafer illustrating the operation of the wafer scanning system.
Figure 3B:
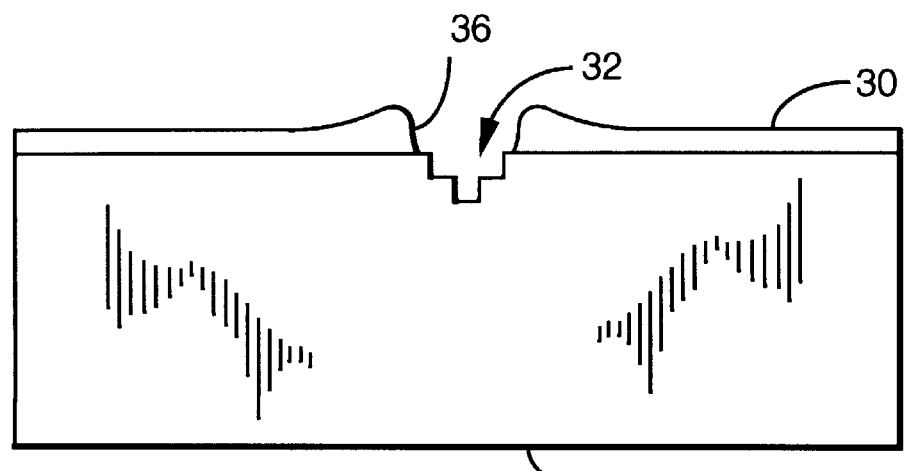

Referring to FIGS. 3A and 3B, magnified cross sections of wafer 16 are shown to illustrate the operation of wafer scanning system 10. Wafer 16 has a conductive, metallic layer 30 deposited thereon for the purposes of conducting electrical signals between selected electrical components formed on wafer 16. Since metallic layer 30 has not yet been patterned to form the desired signal lines and contacts, metallic layer 30 covers substantially the entire surface of wafer 16. In this embodiment, metallic layer 30 is formed of pure copper. However, metallic layer 30 may alternatively comprise aluminum, tungsten, or some other conductive metal or conductive material (including alloys of aluminum, copper, tungsten and other conductive materials) in accordance with the present invention. In this embodiment, metallic layer 30 has a thickness of approximately 1 micron over the surface of wafer 16, although the invention will work with layers of other thicknesses.

Wafer 16 has a trench 32 formed therein which is intended to be filled by metallic layer 30. (Although not explicitly shown, barrier and seed layers may be formed in trench 32 between the trench surface and metallic layer 30.) In this example, trench 32 has a total depth of approximately 0.9 microns and a variable width between 0.3 and 100 microns.

In the deposition process, a void 34 has been formed between the wall of trench 32 and metallic layer 30. Void 34 is illustrative of the defects that may occur in the deposition of metallic layer 30 on wafer 16. Void 34, if left in place during the remainder of the processing of wafer 16, may negatively affect the performance of the resulting integrated circuit.

It is therefore desirable to remove or at least detect the existence of void 34 before further resources are expended in the processing of wafer 16. However, void 34 has no visible effect on the upper surface of metallic layer 30. Void 34 is therefore difficult to detect by mere visual (microscopic) inspection or laser imaging of the surface of wafer 16.

Void 34 typically contains an impurity trapped during the deposition of metallic layer 30. The composition of the impurity trapped in void 34 depends on the ambient conditions in which metallic layer 30 is deposited. For example, if metallic layer 30 is formed by ECD, void 34 contains a liquid electroplating solution. Alternatively, if metallic layer 30 is formed by CVD or PVD, void 34 contains the ambient gas used during deposition. Void 34 may alternatively be a defect formed by a quantity of residual photoresist left on wafer 16 after patterning.

Wafer scanning system 10 serves to make the existence of void 34 apparent upon visual inspection of the surface of wafer 16. This is accomplished by heating the surface of metallic layer 30 sufficiently to cause the fluid or photoresist trapped in void 34 to erupt from void 34, creating a visible anomaly on the surface of metallic layer 30.

Referring to FIG. 3A, laser beam 14 rapidly heats the surface of metallic layer 30. In the case of copper, the delivery of 0.8 J/cm$^2$ over a pulse duration of approximately 50 ns is sufficient to melt approximately the top micron of copper in metallic layer 30. The heating of metallic layer 30 also heats the impurity trapped in void 34, creating high internal pressure within void 34. With the surface of metallic layer 30 being momentarily liquid, the pressurized impurity trapped in void 34 erupts through the surface of metallic layer 30 in an explosive event.

The results may be seen in FIG. 3B, where a crater 36 is left in metallic layer 30 from the eruption of fluid from void 32. Crater 36, along with the metal scattered around crater 36 by the eruption, are clearly visible under a microscope. Indeed, if a pattern of such craters is created on wafer 16 due to a systematic process defect, the crater pattern may be visible to the naked eye on the surface of wafer 16.

A crater similar to crater 36 will also result if a void or other defect occurs within a via formed in the surface wafer 16. Exemplary vias that have been tested to establish the feasibility of the present invention include copper-filled vias with a diameter of approximately 0.3 microns and a depth of approximately 9000 Angstroms.

Figure 4:
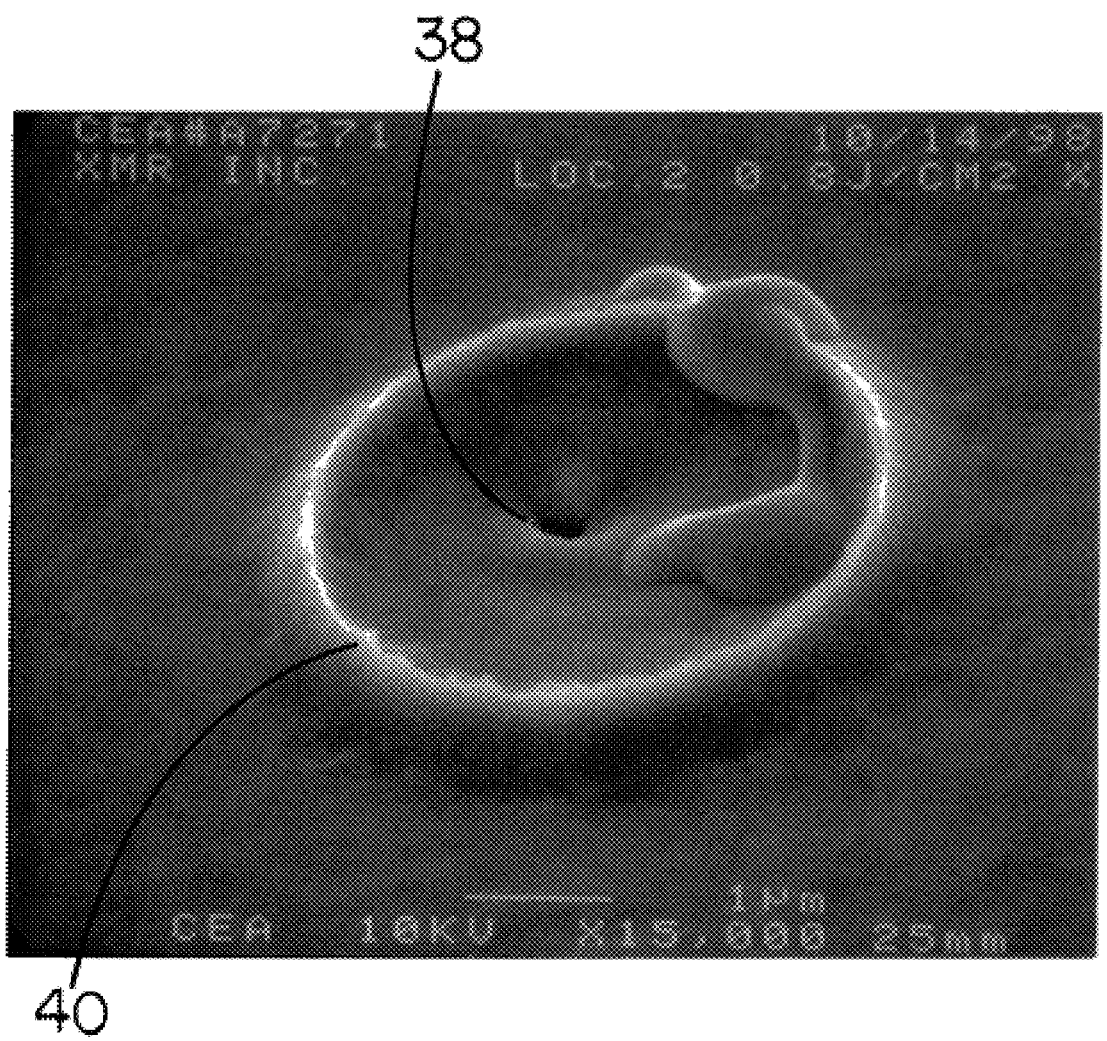
FIG. 4 is a photograph illustrating the result of a scanning operation in accordance with the present invention.

FIG. 4 is a photograph magnified 15,000X illustrating the results of a test of the present invention. A via 38 with a diameter of 0.3 microns and a depth of 9000 Angstroms (i.e. an aspect ratio of approximately 2.7) was filled with copper by electroplating to form a copper layer with a thickness of one micron. Laser scanning as described above was then performed with an XMR Model 5300 laser generating a pulsed beam with a wavelength of approximately 308 mm, a pulse duration of approximately 50 ns and a repetition rate of 300 Hz. As a result of the laser scanning, a defect unintentionally formed in the metal fill via 38 created a detectable crater-like anomaly 40 around via 38.

Thus, the entire wafer may be scanned by projecting laser beam 14 onto successive regions of metallic layer 30. This process may be completed quickly, in a matter of a few seconds, with minimal overlap between successive beam spot regions. For those areas of metallic layer 30 which contain no defects, metallic layer 30 quickly cools and recrystallizes after the laser pulse ends, leaving metallic layer 30 largely unchanged from its original condition.

After the entire wafer has been scanned by laser beam 14, wafer 16 may be inspected to determine whether any defects occurred in the deposition of metallic layer 30. This inspection may be conducted by a human visually observing magnified views of the surface of metallic layer 30, by laser imaging of the surface of metallic layer 30, or by automatic defect detection and classification systems such as a profilometer or SurfScan™ system.

If no visible defects are detected on the surface of metallic layer 30, processing of wafer 16 may continue with the planarization of metallic layer 30 and other standard process steps to form integrated circuit components. However, when a crater 36 is observed on the surface of wafer 16, the wafer may be rejected for further processing, thereby reducing the expenditure of resources on a defective wafer. Furthermore, since the scanning process described herein is not destructive to the features underlying metallic layer 30 (i.e. does not significantly affect underlying p-n junction depths or impurity profiles), wafer 16 may be reworked to remove and re-deposit metallic layer 30. Wafer 16 may thereby be salvaged for further processing. Since wafer cost is a significant component of the cost of producing an integrated circuit chip, the inspection process described herein significantly increases efficiency and reduces cost in semiconductor chip manufacturing.

The above-described wafer scanning process may have other benefits in addition to the defect detection capability outlined above. Because the scanning process involves the melting and recrystallization of substantially the entire surface of metallic layer 30, very small defects (such as microvoids) and crystal irregularities may be automatically corrected in the recrystallization process. This may improve the performance, reliability and uniformity of the integrated circuits produced on wafer 16.

While laser beam parameters have been set forth above for the detection of defects in a deposited copper layer, similar parameters may be calculated for other layer materials. In accordance with the present invention, a laser wavelength, intensity, beam width and pulse duration are preferably chosen so that the amount of energy absorbed by the metallic layer is sufficient to melt most or substantially all of the layer, so as to allow sub-surface defects to erupt through the exposed surface of the layer, without transferring a detrimental amount of heat to the features underlying the layer. These beam parameters may be readily calculated or determined experimentally for a given material with a known absorption spectrum, thermal conductivity and thickness. Indeed, a variety of design choices may be available for a given layer material, from which the most cost-effective or efficient design may be selected. Naturally, a rapid melting of the surface of the metallic layer is preferred, to minimize the amount of energy conducted into the substrate from the metallic layer.

Although the foregoing description has been directed to detection of defects in the deposition of metallic layers, it will be understood that the invention may also be used to detect defects in layers of other materials such as semiconductors and insulators. Furthermore, although the foregoing description has been directed to detection of defects in a layer deposited on a semiconductor wafer, it will be understood that the invention may be used to detect defects in layers formed on other surfaces, such as plastics or metals.

Finally, although the present invention and its advantages have been described in detail, it should be understood that various changes, substitutions, and alterations can be made therein without departing from the spirit and scope of the invention as defined by the appended claims.

We claim:

1. A method for detecting defects in a layer, comprising: projecting radiation on a surface of the layer;
   heating the surface of the layer by the projected radiation so as to melt at least a portion of the layer;
   heating an impurity contained in a defect by the projected radiation so as to increase the pressure of the impurity within the defect sufficiently to cause the impurity to emerge from the defect through the surface of the layer, thereby to create a detectable anomaly in the surface of the layer; and
   scanning the layer to detect the detectable anomaly in the surface of the layer.

2. The method of claim 1, further comprising
   removing the layer in response to the detection of the visible defect; and
   re-depositing the layer.

3. The method of claim 1, wherein projecting radiation on the surface of the layer comprises projecting a laser beam on the surface of the layer.

4. The method of claim 1, wherein scanning the layer for the visible defect comprises inspecting the layer visually under a microscope.

5. The method of claim 1, wherein heating the surface of the layer by the projected radiation comprises delivering a laser beam pulse to the surface of the layer.

6. The method of claim 1, wherein heating the surface of the layer by the projected radiation comprises:
   delivering a laser beam pulse to a first region of the layer so as to melt at least a portion of the first region of the layer;
   allowing the first region of the surface of the layer to cool and resolidify;
   delivering a laser beam pulse to a second region of the layer so as to melt at least a portion of the second region of the layer.

7. The method of claim 1, wherein heating the impurity contained in the defect by the projected radiation comprises vaporizing at least a portion of a volume of electroplating solution contained in the defect.

8. A method for forming an integrated circuit, comprising:
   (a) forming a layer on a substrate;
   (b) projecting radiation on a surface of the layer;
   (c) heating the surface of the layer by the projected radiation so as to melt at least a portion of the layer;
   (d) heating an impurity contained in a defect by the projected radiation so as to increase the pressure of the impurity within the defect sufficiently to cause the impurity to emerge from the defect through the surface of the layer, when such a defect exists in the layer;
   (e) scanning the layer for a visible defect created by the emergence of the impurity from the defect; and
   (f) patterning the layer to form integrated circuit components in response to an absence of visible defects.

9. The method of claim 8, further comprising:
   removing the layer in response to the detection of the visible defect; and
   repeating steps (a) through (f) to form integrated circuit components.

10. The method of claim 8, further comprising forming a barrier layer on the substrate prior to forming the layer.

11. The method of claim 10, further comprising forming a seed layer on the barrier layer prior to forming the layer, wherein the step of forming the layer comprises depositing a substance on the seed layer.

12. The method of claim 8, wherein forming the layer on the substrate comprises depositing a metallic material on the substrate.

13. The method of claim 12, wherein depositing the metallic material on the substrate comprises electrochemically depositing the metallic material on the substrate.

14. The method of claim 12, wherein depositing the metallic material on the substrate comprises conducting chemical vapor deposition of the metallic material on the substrate.

* * * * *